US006417533B2

(12) United States Patent
Kawata et al.

(10) Patent No.: US 6,417,533 B2
(45) Date of Patent: Jul. 9, 2002

(54) SEMICONDUCTOR DEVICE HAVING CAPACITOR WHICH ASSURES SUFFICIENT CAPACITY WITHOUT REQUIRING LARGE SPACE AND METHOD OF PRODUCING THE SAME

(75) Inventors: Masato Kawata; Kuniko Kikuta, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/815,841

(22) Filed: Mar. 23, 2001

(30) Foreign Application Priority Data

Mar. 24, 2000 (JP) .......................................... 2000-085175

(51) Int. Cl.⁷ ............................................... H01L 29/72
(52) U.S. Cl. ...................... 257/296; 257/303; 257/304; 257/306; 257/773; 257/774
(58) Field of Search ................................ 257/238, 296, 257/303, 304, 306, 773, 774

(56) References Cited

FOREIGN PATENT DOCUMENTS

| JP | 5-283611 | 10/1993 | |
| JP | 9-64284 | 3/1997 | |
| JP | 09-064284 | * 7/1997 | ................. 257/238 |

* cited by examiner

Primary Examiner—Edward Wojciechowicz
(74) Attorney, Agent, or Firm—Katten Muchin Zavis Rosenman

(57) ABSTRACT

In a semiconductor device comprising first and second layer wirings formed with a space left therebetween and a capacitor formed in the space and electrically connected to the first and the second layer wirings, the capacitor comprises a via electrically connected to one of the first and the second layer wirings, an electrode made of a conductive material and electrically connected to the one of the first and the second layer wirings through the via, and a dielectric film formed between the electrode and the other of the first and the second layer wirings.

7 Claims, 14 Drawing Sheets

SEMICONDUCTOR DEVICE HAVING CAPACITOR WHICH ASSURES SUFFICIENT CAPACITY WITHOUT REQUIRING LARGE SPACE AND METHOD OF PRODUCING THE SAME

BACKGROUND OF THIS INVENTION

The present invention relates to a semiconductor device, and particularly relates to a semiconductor device having a capacitor formed between wirings.

Conventionally, an LSI (Large Scale Integrated-circuit) chip is known as a semiconductor device which has a plurality of wirings (multi level inter-contacts).

In the LSI chip, although an external bypass-capacitor can provide high capacitance, it cannot sufficiently deal with and restrain an IR drop of potential of the internal wiring for the power supply because the LSI chip is becoming enlarged in dimension and, accordingly, an internal wiring for a power supply is becoming lengthened in these recent years. Moreover, it is difficult to form the internal wiring for the power supply with a sufficient width because the semiconductor devices in present days are becoming highly integrated and having a high density.

Considering the above, a proposal has been made about a bypass-capacitor (which will be simply referred to as a capacitor hereinbelow) for restraining the IR drop of a power supply line and for stabilizing potential. The capacitor is provided with a capacity film which serves as a gate insulating film formed on the semiconductor chip, a lower electrode serves as a lower substrate formed under the gate insulating film, and an upper electrode serves as an electrode formed on the gate insulating film.

However, because the capacity film is formed on the substrate by using the gate insulating film in the capacitor (bypass-capacitor), the capacitor requires a plenty of space on the periphery portion of the semiconductor device. With this structure, the dimension of the semiconductor device will be inadvantageously enlarged. Furthermore, if a leak occurs due to the reduction of the thickness of the gate insulating film, the capacitor cannot perform efficiently. In addition, because the capacity film cannot be formed on a desired position of the semiconductor device, the capacity film is compelled to be formed on an empty space, in other words, on the region where it is not most suitable for restraining the IR drop.

In order to restrain the IR drop of the power supply line and to stabilize the potential in a multi layer wirings-structure, proposal has been made about a semiconductor integrated circuit and a semiconductor device, each disclosed in Japanese Unexamined Patent Publications (JP-A) Nos. 64284/1997 (Tokkai Hei 9-64284) and 283611/1993 (Tokkai Hei 5-283611), respectively.

The semiconductor integrated circuit has first and second layer wirings superimposed over each other. The first and the second layer wirings serve as first and second power supply wirings, respectively. Between the first and the second power supply wirings, a capacity layer is formed. Consequently, an internal bypass capacitor is formed in the semiconductor integrated circuit.

On the other hand, the semiconductor device has lower and upper layer wirings formed along a peripheral edge region of one main surface of a semiconductor substrate. The lower and the upper layer wirings serve as set potential and power supply wirings, respectively. Between the lower and the upper layer wirings, an inter-layer dielectric film made by a thin insulating film or a high dielectric film is formed. Consequently, a capacitor is formed in the semiconductor device.

However, in the semiconductor integrated circuit, the inter-layer dielectric film cannot be reduced in thickness because the power supply layer wiring and a signal line layer are formed so as to utilize the same layer in common and therefore the semiconductor integrated circuit cannot secure high capacitance between the first and the second layer wirings. If the thickness of the inter-layer dielectric film as the dielectric film is reduced for the purpose of ensuring a practical high capacitance, a coupling capacity of the signal line existing on the same layer as the power supply wiring will be increased. This, as a result, lowers a transmitting speed of the signal. Furthermore, in accordance with the minimization with respect to the pitch or an interval space between each wirings, the inter-layer dielectric film is required to have low dielectric constant.

In the semiconductor device, it is difficult to form small hole on the inter-layer dielectric film because the inter-layer dielectric film is thick. Accordingly, the inter-layer dielectric film should be bored a large hole in advance to forming the upper electrode. For this purpose, the inter-layer dielectric film requires larger width than that of the power supply wiring. This makes a surface of the semiconductor device rough and difficult to make the surface of the semiconductor device flat.

SUMMARY OF THE INVENTION

In view of the above, it is an object of the present invention to provide a semiconductor device having a capacitor which assures sufficient and high capacitance without requiring large area only for forming the capacitor. Furthermore, the semiconductor device can restrain an IR drop of a power supply line and can stabilize potential.

The other objects, features, and advantages of the present invention will become clear as the description proceeds.

A semiconductor device to which this invention is applicable comprises first and second layer wirings formed with a space left therebetween and a capacitor which is formed in the space and which is electrically connected to the first and the second layer wirings. The capacitor comprises a via electrically connected to one of the first and the second layer wirings, an electrode made of a conductive material and electrically connected to one of the first and the second layer wirings through the via, and a dielectric film formed between the electrode and another one of the first and the second layer wirings.

A method of producing a semiconductor device according to the invention is applicable to the semiconductor device comprising first and second layer wirings formed with a space left therebetween and a capacitor formed in the space and electrically connected to the first and the second layer wirings. The method comprises the step of forming the lower layer wiring which serves as a lower electrode of the capacitor. The method further comprises the steps of forming a dielectric film on the lower electrode, forming an upper electrode of the capacitor on the dielectric film, forming a via so as to be electrically connected to the upper electrode, and forming an upper layer wiring so as to be electrically connected to the via.

DESCRIPTION OF THE PREFERRED EMBODIMENTS

Description will be made about a semiconductor device and the method of producing the same according to an embodiment of this invention.

Figure 1:
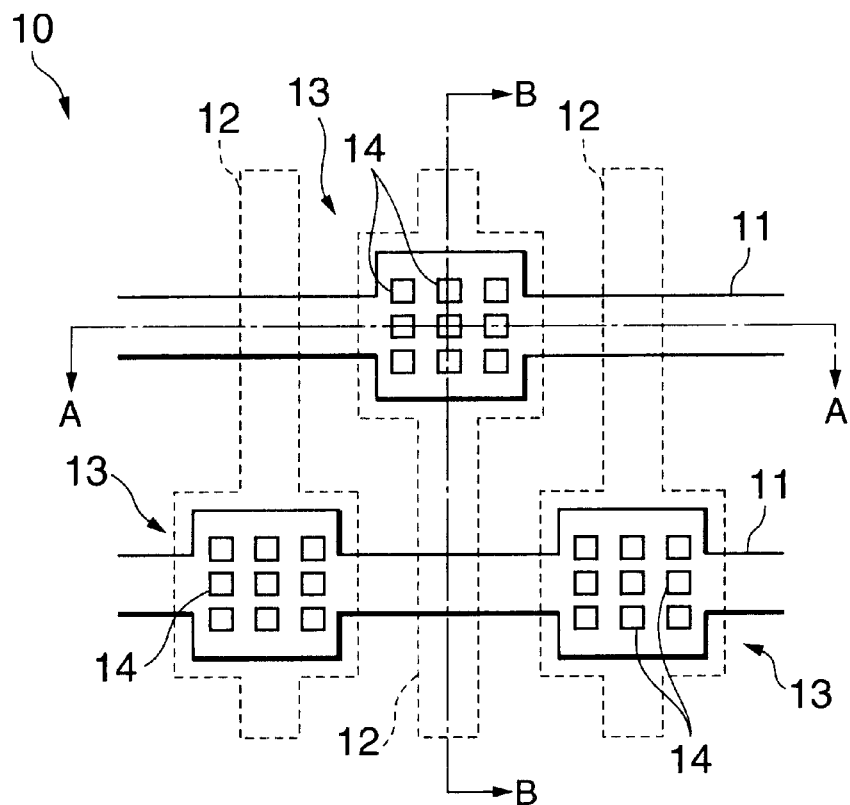
FIG. 1 is a plan view showing an inner wiring structure of a semiconductor device according to an embodiment of this invention.

FIG. 1 is a plan view showing an inner wiring structure of the semiconductor device according to the embodiment of this invention. As shown in FIG. 1, the semiconductor device 10 has an inner layer wiring formed as a multi layer structure. Namely, upper layer wirings 11 and lower layer wirings 12 are arranged so as to be superposed and generally are placed at right angles to each other. The upper layer wirings 11 are provided with a plurality of wirings arranged in line to one another. The lower layer wirings 12 are arranged under the upper layer wirings and also provided with a plurality of wirings arranged in line to one another.

Generally, power supply wirings and grounding (GND) wirings in the same layer wiring are arranged so as to be paired with each other as follows: "power supply and GND", "power supply and GND", and so on. Because the upper and the lower layer wirings 11 and 12 respectively serve as the power supply and the GND wirings and are apparently lain at right angles to each other, the power supply and the GND wirings are apparently arranged as a grid by plan-viewing. Via-formed areas 13 exist where the upper and the lower layer wirings 11 and 12 are apparently lain at right angles. In the via-formed areas 13, a plurality of vias 14 for electrically connecting the upper layer wiring 11 and/or the lower layer wiring 12 with upper electrode and/or lower electrode of capacitor mentioned below are formed, respectively.

Consequently, between the upper layer wiring 11 serving as a power supply-GND layer wiring and the lower layer wiring 12 serving as a power supply-GND layer wiring in the semiconductor device 10, a decoupling capacity is formed. The decoupling capacity restrains the IR drop of a power supply line and stabilizes a power supply wiring potential so that noise of the power supply is reduced.

Now, a method of producing the semiconductor device 10, particularly, a wiring process of forming the decoupling capacity between the upper layer wiring 11 and the lower layer wiring 12 will be described with examplifying by a normal process and a single or a dual damascene process. In figures referred to the following description, element such as transistor element and the other layer wiring arranged under the lower layer wiring 12 is omitted in description and illustration. In addition, because after processes carried out after the upper layer wiring 11 is formed are the same as the conventional wiring process, the after process are also omitted in description and illustration.

Figure 2:
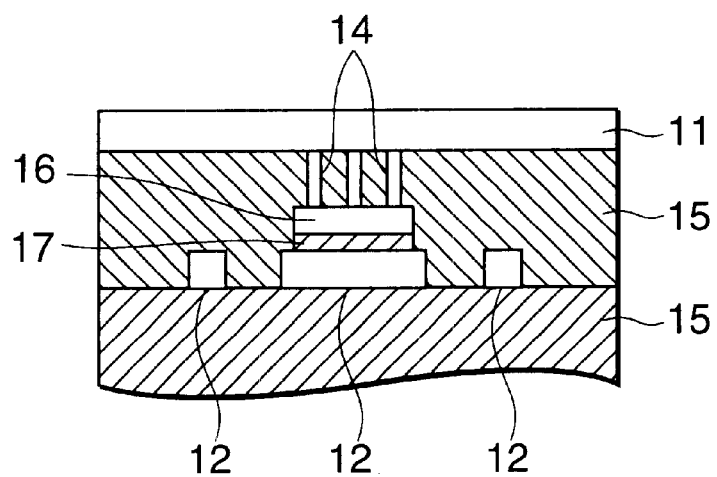
FIG. 2 is a cross sectional view, taken along a line A—A in FIG. 1, showing the semiconductor device which uses a lower layer wiring as an electrode of a capacitor.

(A) Normal Wiring Process (1) Process A in which Lower Layer Wiring is used as Electrode of Capacitor FIG. 2 is a cross sectional view, along a line A—A in FIG. 1, showing the semiconductor device which uses a lower layer wiring as an electrode of a capacitor in a normal wiring process. FIGS. 3A to 3E are cross sectional views illustrating a wiring process of the semiconductor device shown in FIG. 2.

Referring to FIG. 2, the semiconductor device 10 (FIG. 1) uses the lower layer wiring 12 as an electrode of a capacitor. A dielectric film 17 is formed in an interlayer dielectric film 15 between the upper and the lower layer wirings 11 and 12. More concretely, the dielectric film 17 is formed between an upper electrode 16 electrically connected to the upper layer wiring 11 through the vias 14 and the lower layer wiring 12.

Figure 3A:
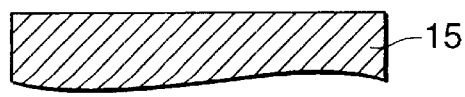
FIGS. 3A to 3E are cross sectional views illustrating a wiring process of the semiconductor device shown in FIG. 2.
Figure 3B:
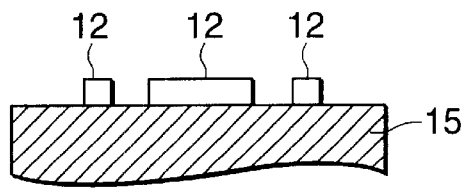

Referring to FIGS. 3A to 3E, titanium nitride (TiN), aluminum (Al), and the TiN are, in this order, deposited by a sputtering or the like on the inter-layer dielectric film 15 (FIG. 3A) previously planarized by a chemical mechanical polishing (CMP). The inter-layer dielectric film 15 is treated by a lithography process and etched by a dry etching and the like. Thus, the lower layer wirings 12 are formed on the inter-layer dielectric film 15 (FIG. 3B). The lower layer wirings 12 have a TiN-Al-TiN structure.

Next, the dielectric film 17 is formed on the insulating film 15 provided with the lower layer wirings 12. Herein, SiO$_2$ is deposited and made into an SiO$_2$ film by a plasma CVD (Chemical Vapor Deposition) process. The SiO$_2$ film serves as the dielectric film 17.

As the dielectric film 17, a high dielectric film such as an oxide film, a nitride film, a tantalum oxide film, and a barium strontium titanate (BST) film are can be used. It is preferable that the dielectric film 17 is as thin as possible in order to rise the capacitor in capacitance. However, because thickness of the dielectric film 17 is limited by a leak electric current (leak current), particularly by a tunnel electric current (tunnel current), it is appropriate that a scope of the thickness is approximate 0.5 to 20.0 nm in practical film thickness.

After the dielectric film 17 is formed on the insulating film 15, a tungsten (W) film, as an electrode material film 16a for forming the upper electrode 16, is provided on the dielectric film 17 formed on the insulating film 15 by depositing the W by the sputtering and the like. It is preferable that thickness of the electrode material film 16a is as thin as possible in order to easily flat the inter-layer dielectric film 15 to be formed hereafter. However, because the upper electrode 16 is risen in electric resistance if the thickness of the electrode material film 16a is too thin, it is appropriate that a scope of the thickness is approximate 50 to 500 nm in a practical film thickness.

Figure 3C:
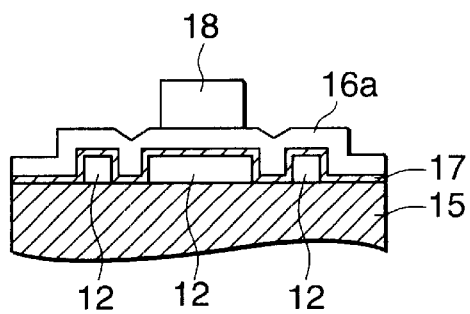

Then a resist pattern 18 is formed on the electrode material film 16a after the lithography process (FIG. 3C). The inter-layer dielectric film 15 provided with the electrode material film 16a is etched by the dry etching and the like with using the resist pattern 18 as a mask. Thus, the upper electrode 16 and the dielectric film 17 corresponding to the upper electrode 16 are formed.

Figure 3D:
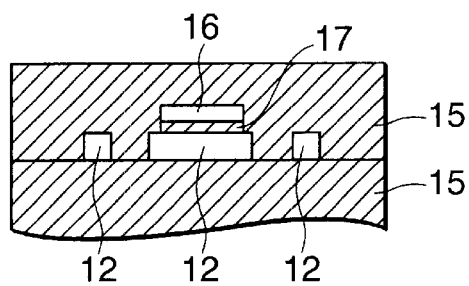
Figure 3E:
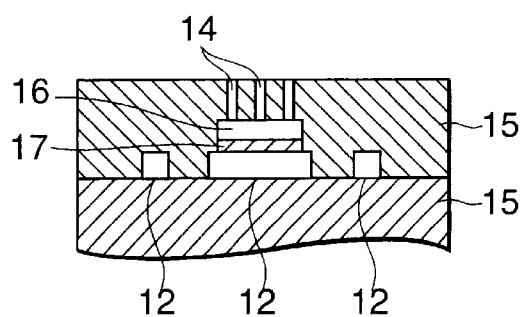

Next, the inter-layer dielectric film 15 is further formed on the inter-layer dielectric film 15 provided with the upper electrode 16 and the dielectric film 17. Herein, an SiOF and the like-film, as a low dielectric (Low-k) insulating film generally having lower relative dielectric than the SiO$_2$, is formed by the plasma CVD process. Then the last inter-layer dielectric film 15 is planarized by the CMP (FIG. 3D). After planarizing the inter-layer dielectric film 15 by the CMP, the inter-layer dielectric film 15 is treated by the lithography process and etched by the dry etching and the like. Thus, through-holes to be the vias 14 are formed on the inter-layer dielectric film 15 so as to reach the upper electrode 16. Then conductor is perfectly embedded in the through-holes, respectively and thus the vias 14 are formed on the inter-layer dielectric film 15 so as to reach the upper electrode 16 (FIG. 3E). The vias 14 are, for example, formed by driving in or hammering tacks, such that a plurality of holes having the minimum dimension diameter are bored in the upper electrode 16 as a connecting object.

Then as like as the process of forming the lower layer wirings 12, the TiN, the Al, and the TiN are, in this order, deposited by the sputtering or the like on the inter-layer dielectric film 15. The inter-layer dielectric film 15 is treated by the lithography process and etched by the dry etching and the like. Thus, the upper layer wiring 11 is formed on the inter-layer dielectric film 15 (FIG. 2). The upper layer wiring 11 has the TiN—Al—TiN structure.

Thus, the upper electrode 16 is formed through the dielectric film 17 on the lower layer wiring 12 as the lower electrode. Consequently, the decoupling capacity is formed between the upper layer wiring 11 and the lower layer wiring 12.

Figure 4:
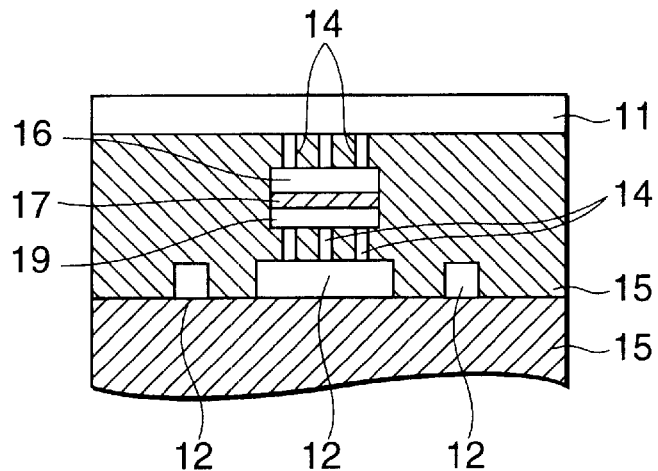
FIG. 4 is a cross sectional view, taken along the line A—A in FIG. 1, showing the semiconductor device which does not use a wiring as an electrode of a capacitor.
Figure 5A:
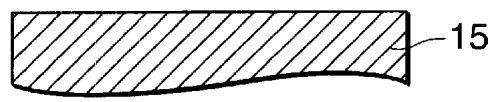
FIGS. 5A to 5C are cross sectional views illustrating (the first half of) a wiring process of the semiconductor device shown in FIG. 4.
Figure 5B:
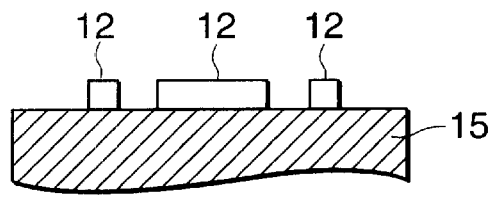
Figure 5C:
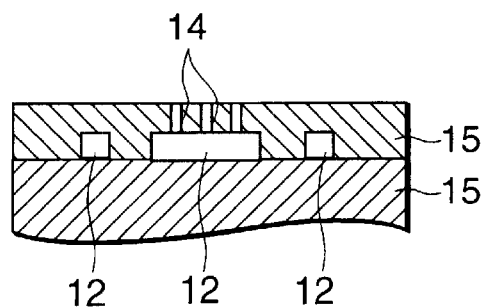
Figure 6A:
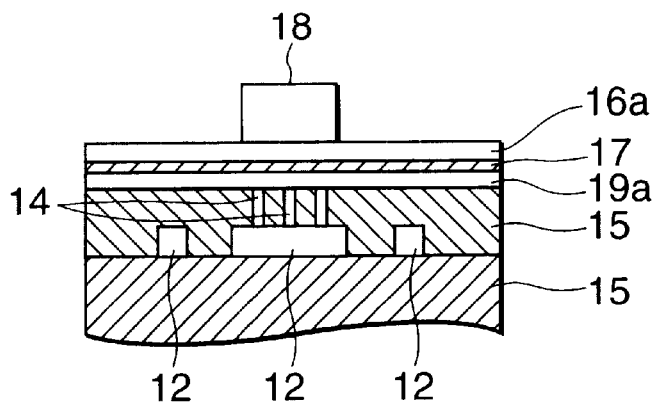
FIGS. 6A to 6C are cross sectional views illustrating (the second half of) the wiring process of the semiconductor device shown in FIG. 4.
Figure 6B:
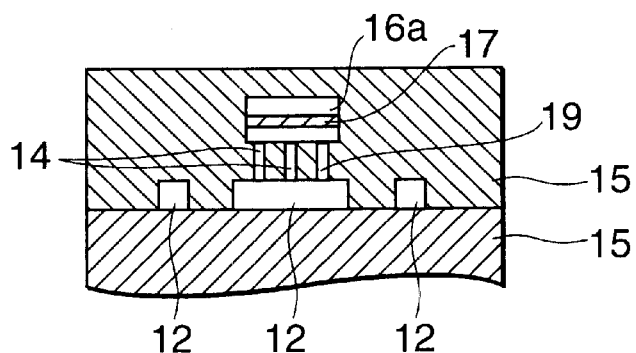
Figure 6C:
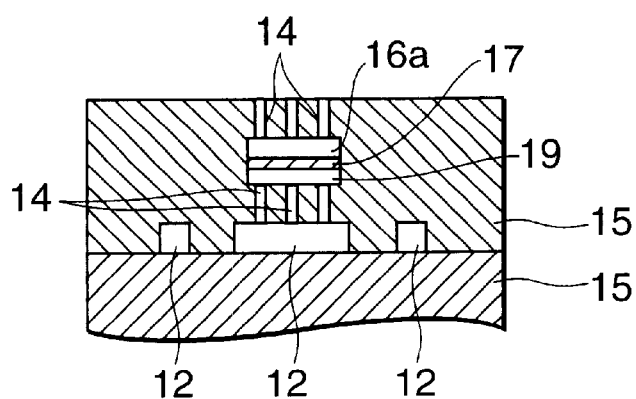

(2) Process A in which neither Lower nor Upper Layer Wirings is used as Electrodes of Capacitor FIG. 4 is a cross sectional view, along the line A—A in FIG. 1, showing the semiconductor device which uses neither lower nor upper layer wiring as an electrode of a capacitor in the normal wiring process. FIGS. 5A to 5C are cross sectional views illustrating (the first half of) a wiring process of the semiconductor device shown in FIG. 4. FIGS. 6A to 6C are cross sectional views illustrating (the second half of) the wiring process of the semiconductor device shown in FIG. 4.

Referring to FIG. 4, the semiconductor device 10 (FIG. 1) uses neither the lower layer wiring 12 nor the upper layer wiring 11 as electrodes of a capacitor. A dielectric film 17 is formed in an inter-layer dielectric film 15 between the upper and the lower layer wirings 11 and 12. More concretely, the dielectric film 17 is formed between an upper electrode 16 electrically connected to the upper layer wiring 11 through the vias 14 and a lower electrode 19 electrically connected to the lower layer wiring 12 through the vias 14.

Referring to FIGS. 5A to 5C and 6D to 6F, the lower layer wirings 12 having the TiN—Al—TiN structure are formed on the inter-layer dielectric film 15 (FIG. 5A) previously planarized by the CMP (FIG. 5B). These process-steps are same as the process A-1 shown in FIGS. 3A and 3B.

Next, the inter-layer dielectric film 15 is further formed on the inter-layer dielectric film 15 provided with the lower layer wirings 12. Herein, the SiOF and the like-film, as the Low-k insulating film generally having lower relative dielectric than the SiO$_2$, is formed by the plasma CVD process. Then the last inter-layer dielectric film 15 is planarized by the CMP. After planarizing the interlayer dielectric film 15 by the CMP, the inter-layer dielectric film 15 is treated by the lithography process and etched by the dry etching and the like. Thus, through-holes to be the vias 14 are formed on the inter-layer dielectric film 15 so as to reach the lower layer wiring 12. Then the conductor is perfectly embedded in the through-holes, respectively and thus the vias 14 are formed on the inter-layer dielectric film 15 so as to reach the lower layer wiring 12 (FIG. 5C).

Then the W film, as an electrode material film 19a for forming the lower electrode 19, is provided on the insulating film 15 by depositing the W by the sputtering and the like. It is preferable that thickness of the electrode material film 19a is as thin as possible in order to easily flat the inter-layer dielectric film 15 to be formed hereafter. However, because the lower electrode 19 is risen in electric resistance if the thickness of the electrode material film 19a is too thin, it is appropriate that a scope of the thickness is approximate 50 to 500 nm in a practical film thickness.

Next, the dielectric film 17 is formed on the electrode material film 19a. As the dielectric film 17, the high dielectric film such as the oxide film, the nitride film, the tantalum oxide film, and the barium strontium titanate (BST) film are can be used. It is preferable that the dielectric film 17 is as thin as possible in order to rise the capacitor in capacitance. However, because thickness of the dielectric film 17 is limited by the leak current, particularly by the tunnel current, it is appropriate that a scope of the thickness is approximate 0.5 to 20.0 nm in practical film thickness.

After the dielectric film 17 is formed on the insulating film 15, the W film, as an electrode material film 16a for forming the upper electrode 16, is provided on the dielectric film 17 formed on the insulating film 15 by depositing the W by the sputtering and the like. It is preferable that thickness of the electrode material film 16a is as thin as possible in order to easily flat the inter-layer dielectric film 15 to be formed hereafter. However, because the upper electrode 16 is risen in electric resistance if the thickness of the electrode material film 16a is too thin, it is appropriate that a scope of the thickness is approximate 50 to 500 nm in a practical film thickness.

After forming a three-layers structure: the electrode material film 19a for forming the lower electrode 19, the dielectric film 17, and the electrode material film 16a for forming the upper electrode 16, a resist pattern 18 is formed on the electrode material film 16a after the lithography process (FIG. 6A). The inter-layer dielectric film 15 provided with the electrode material film 16a is etched by the dry etching and the like with using the resist pattern 18 as a mask. Thus, the upper electrode 16 and the dielectric film 17 corresponding to the upper electrode 16 are formed.

Next, the inter-layer dielectric film 15 is still further formed on the inter-layer dielectric film 15 provided with the lower electrode 19, the dielectric film 17, and the upper electrode 16. Herein, the SiOF and the like-film, as the Low-k insulating film generally having lower relative dielectric than the SiO$_2$, is formed by the plasma CVD process. Then the last inter-layer dielectric film 15 is planarized by the CMP (FIG. 6B). After planarizing the inter-layer dielectric film 15 by the CMP, the inter-layer dielectric film 15 is treated by the lithography process and etched by the dry etching and the like. Thus, through-holes to be the vias 14 are formed on the inter-layer dielectric film 15 so as to reach the upper electrode 16. Then conductor is perfectly embedded in the through-holes, respectively and thus the vias 14 are formed on the inter-layer dielectric film 15 so as to reach the upper electrode 16 (FIG. 6C).

Then as like as the process of forming the lower layer wirings 12, the TiN, the Al, and the TiN are, in this order, deposited by the sputtering or the like on the inter-layer dielectric film 15. The inter-layer dielectric film 15 is treated by the lithography process and etched by the dry etching and the like. Thus, the upper layer wiring 11 is formed on the inter-layer dielectric film 15 (FIG. 4). The upper layer wiring 11 has the TiN—Al—TiN structure.

Thus, the upper electrode 16 is formed through the dielectric film 17 on the lower electrode 19. Consequently, the decoupling capacity is formed between the upper layer wiring 11 and the lower layer wiring 12. Namely, the capacitor is arranged between the upper layer wiring 11 and the lower layer wiring 12.

(3) Process A in which Upper Layer Wiring is used as Electrodes of Capacitor

Figure 7:
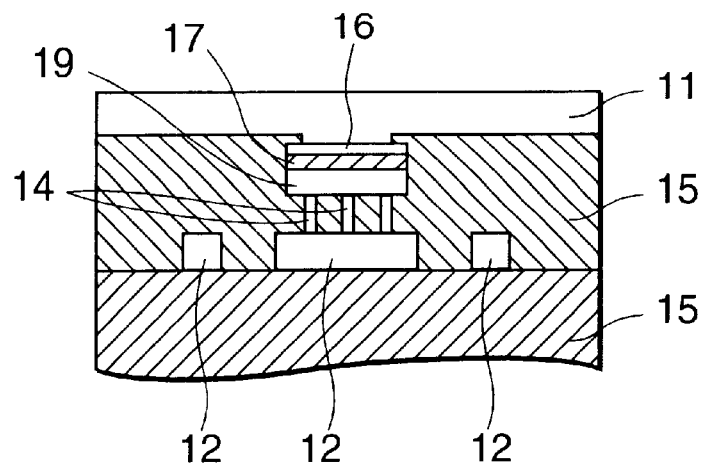
FIG. 7 is a cross sectional view, along the line A—A in FIG. 1, showing the semiconductor device which uses an upper layer wiring as an electrode of a capacitor.
Figure 8A:
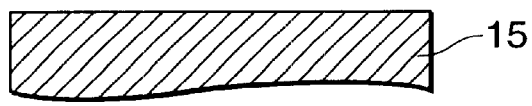
FIGS. 8A to 8C are cross sectional views illustrating (the first half of) a wiring process of the semiconductor device shown in FIG. 7.
Figure 8B:
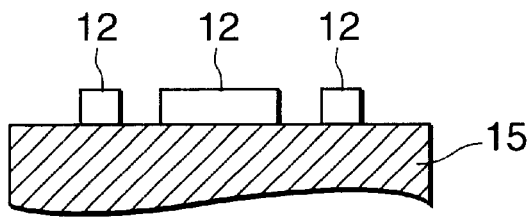
Figure 8C:
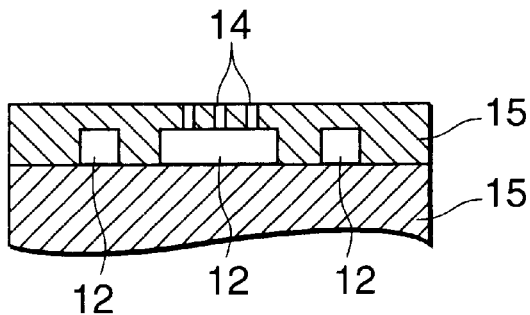

FIG. 7 is a cross sectional view, along the line A—A in FIG. 1, showing the semiconductor device which uses a lower layer wiring as an electrode of a capacitor in the normal wiring process. FIGS. 8A to 8C are cross sectional views illustrating (the first half of) a wiring process of the semiconductor device shown in FIG. 7. FIGS. 9A to 9D are cross sectional views illustrating (the second half of) the wiring process of the semiconductor device shown in FIG. 7.

Referring to FIG. 7, the semiconductor device 10 (FIG. 1) uses the upper layer wiring 11 as an electrode of a capacitor. A dielectric film 17 is formed in an interlayer dielectric film 15 between the upper and the lower layer wirings 11 and 12. More concretely, the dielectric film 17 is formed between an upper electrode 16 and a lower electrode 19 electrically connected to the lower layer wiring 12 through the vias 14.

Referring to FIGS. 8A to 8C and 9D to 9G, the lower layer wirings 12 having the TiN—Al—TiN structure are formed on the inter-layer dielectric film 15 (FIG. 8A) previously planarized by the CMP (FIG. 8B). Then the inter-layer dielectric film 15 served by the Low-k insulating film is further formed on the inter-layer dielectric film 15 provided with the lower layer wirings 12. The last interlayer dielectric film 15 is planarized by the CMP. After planarizing the inter-layer dielectric film 15 by the CMP, through-holes to be the vias 14 are formed on the interlayer dielectric film 15 so as to reach the lower layer wiring 12. The conductor is perfectly embedded in the through-holes, respectively and thus the vias 14 are formed on the inter-layer dielectric film 15 so as to reach the lower layer wiring 12 (FIG. 8C).

Figure 9A:
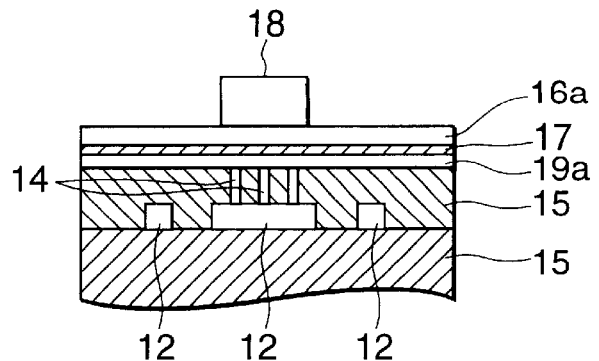
FIGS. 9A to 9D are cross sectional views illustrating (the second half of) the wiring process of the semiconductor device shown in FIG. 7.
Figure 9B:
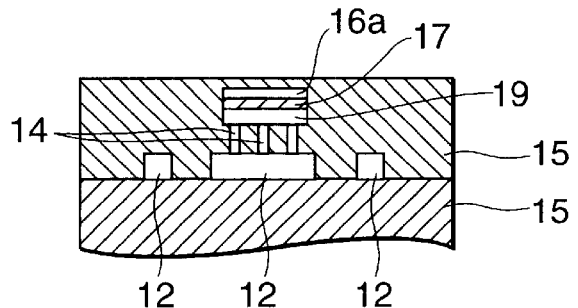

After forming a three-layers structure: the electrode material film 19a for forming the lower electrode 19, the dielectric film 17, and the electrode material film 16a for forming the upper electrode 16, a resist pattern 18 is formed on the electrode material film 16a after the lithography process (FIG. 9A). The inter-layer dielectric film 15 provided with the electrode material film 16a is etched by the dry etching and the like with using the resist pattern 18 as a mask. Thus, the upper electrode 16 and the dielectric film 17 corresponding to the upper electrode 16 are formed. Next, the inter-layer dielectric film 15 served by the Low-k insulating film is still further formed on the inter-layer dielectric film 15 provided with the lower electrode 19, the dielectric film 17, and the upper electrode 16.

These process-steps are same as the process A-2 shown in FIGS. 5A to 5C, 6D, and 6E.

Figure 9C:
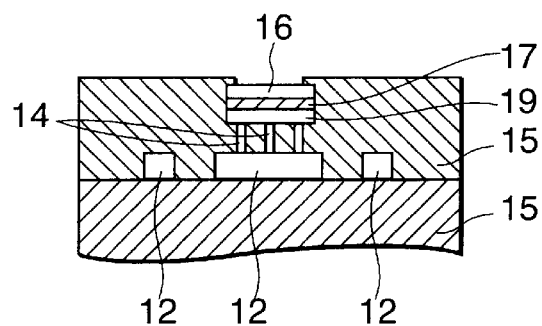
Figure 9D:
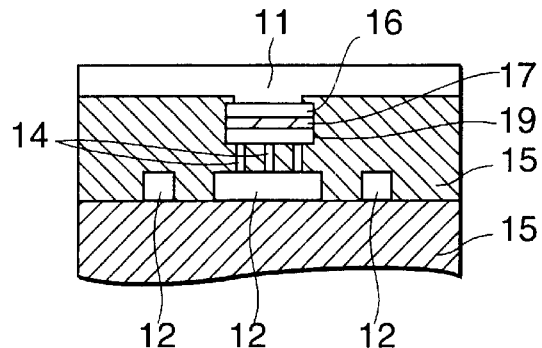

Next, the last inter-layer dielectric film 15 is planarized by the CMP. Herein, it is appropriate that a scope of a thickness of the inter-layer dielectric film 15 on the upper electrode 16 is approximate 50 to 500 nm in a practical film thickness. After planarizing the interlayer dielectric film 15 by the CMP, the inter-layer dielectric film 15 is treated by the lithography process. Only the inter-layer dielectric film 15 on the upper electrode 16 is etched by the dry etching and the like with using the upper electrode 16 as an etching stopper. Thus, a major area of a top surface of the upper electrode 16 is exposed on a top surface of the inter-layer dielectric film 15 (FIG. 9C).

Then as like as the process of forming the lower layer wirings 12, the TiN, the Al, and the TiN are, in this order, deposited by the sputtering or the like on the inter-layer dielectric film 15. The inter-layer dielectric film 15 is treated by the lithography process and etched by the dry etching and the like. Thus, the upper layer wiring 11 is formed on the inter-layer dielectric film 15 (FIG. 7). The upper layer wiring 11 has the TiN—Al—TiN structure.

Thus, the lower electrode 19 is formed through the dielectric film 17 under the upper layer wiring 11 serving as the upper electrode in cooperation with the upper electrode 16. Consequently, the decoupling capacity is formed between the upper layer wiring 11 and the lower layer wiring 12.

Figure 10:
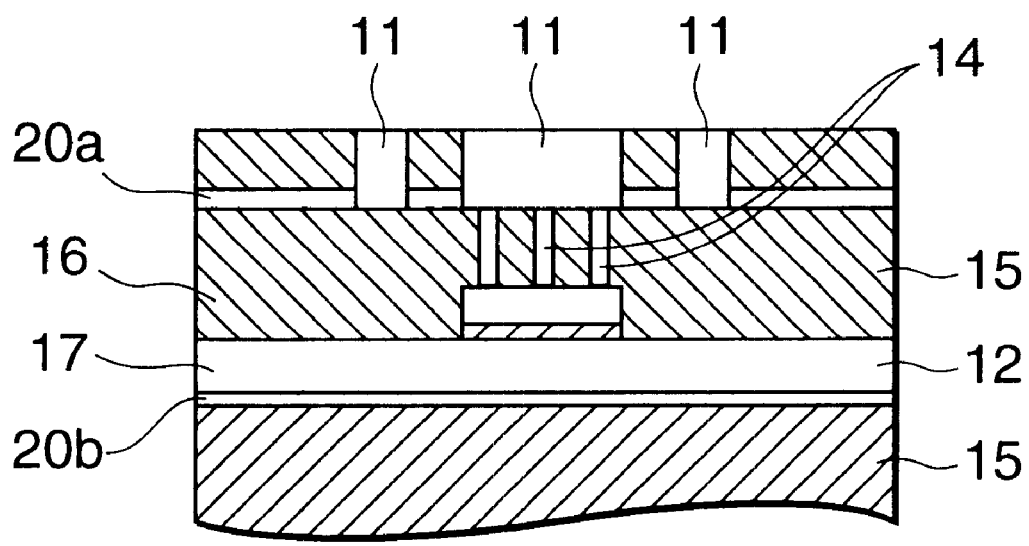
FIG. 10 is a cross sectional view, taken along a line B—B in FIG. 1, showing the semiconductor device which uses a lower layer wiring as an electrode of a capacitor in a damascene process.

(B) Damascene Wiring Process (1) Process B in which Lower Layer Wiring is used as Electrode of Capacitor FIG. 10 is a cross sectional view, along a line B—B in FIG. 1, showing the semiconductor device which uses a lower layer wiring as an electrode of a capacitor in a damascene wiring process. FIGS. 11A to 11D are cross sectional views illustrating (the first half of) a wiring process of the semiconductor device shown in FIG. 10. FIGS. 12A to 12C are cross sectional views illustrating (the second half of) the wiring process of the semiconductor device shown in FIG. 10.

Referring to FIG. 10, the semiconductor device 10 (FIG. 1) uses the lower layer wiring 12 as an electrode of a capacitor. A dielectric film 17 is formed in an interlayer dielectric film 15 served by the Low-k insulating film between the upper and the lower layer wirings 11 and 12. More concretely, the dielectric film 17 is formed between an upper electrode 16 electrically connected to the upper layer wiring 11 through the vias 14 and the lower layer wiring 12.

Figure 11A:
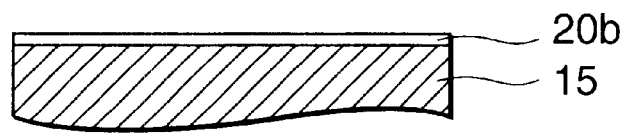
FIGS. 11A to 11D are cross sectional views illustrating (the first half of) a wiring process of the semiconductor device shown in FIG. 10.
Figure 11B:
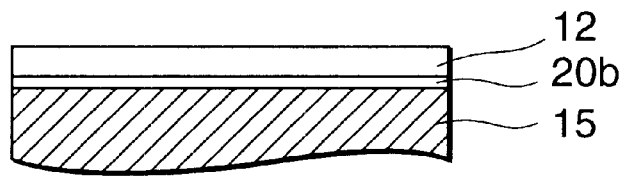

Referring to FIGS. 11A to 11D and 12E to 12G, the lower layer wirings 12 is formed, by a normal damascene process, on the inter-layer dielectric film 15 (FIG. 11A) previously planarized by the CMP (FIG. 11B). More concretely, a silicon nitride (SiN) film 20B as the etching stopper is formed on the inter-layer dielectric film 15 (FIG. 11A). Then the inter-layer dielectric film (not shown) is further formed on the SiN film 20B. Next, trenches for wiring (not shown) are formed on the interlayer dielectric film. Copper (Cu) and the like is embedded in the trench. Then the inter-layer dielectric film is planarized by the CMP. Thus, lower layer wiring 12 having an embedding structure is formed on the SiN film 20B (FIG. 11B).

Figure 11C:
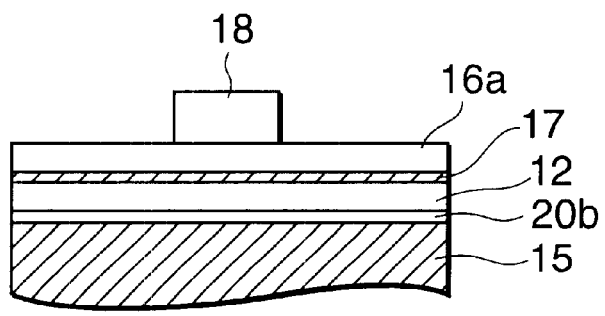
Figure 11D:
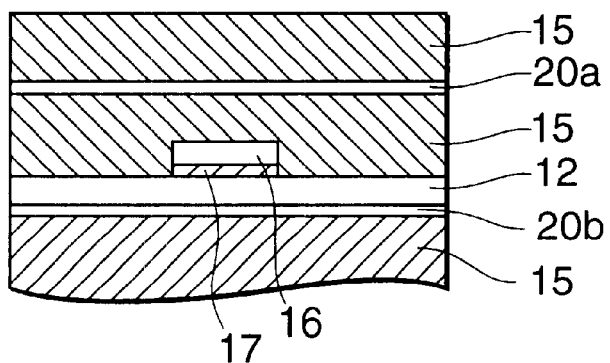
Figure 12A:
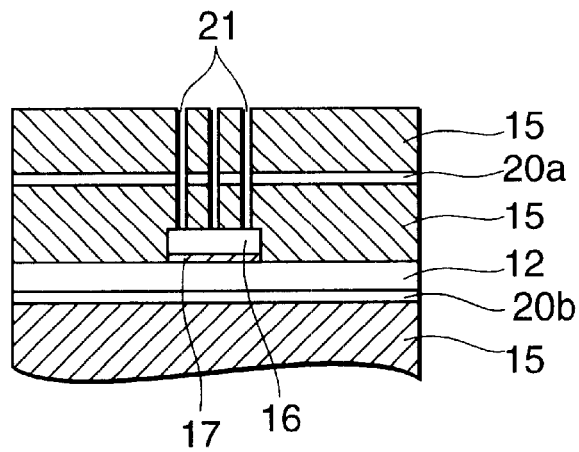
FIGS. 12A to 12C are cross sectional views illustrating (the second half of) the wiring process of the semiconductor device shown in FIG. 10.
Figure 12B:
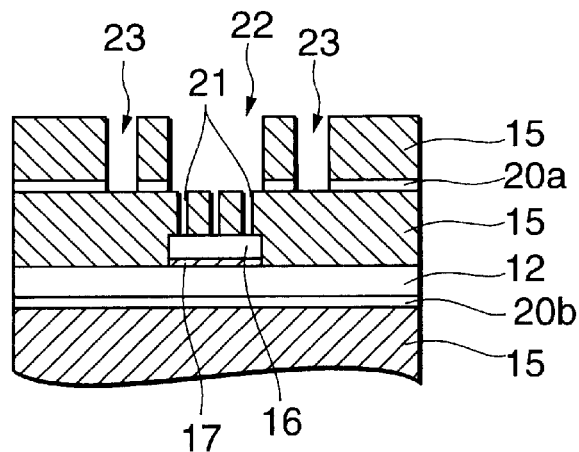
Figure 12C:
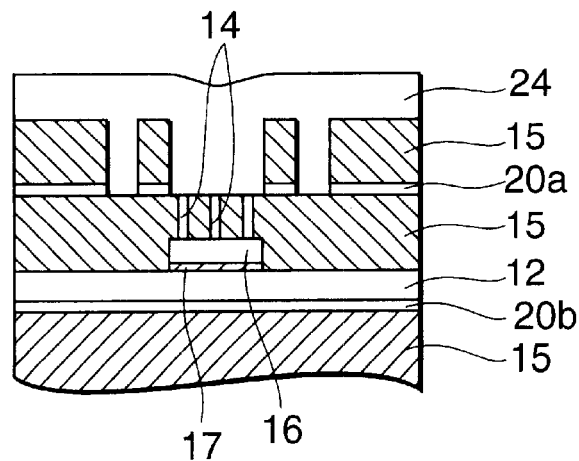

After forming the lower layer wiring 12, the dielectric film 17 and the electrode material film 16a are formed in this order. Furthermore, the resist pattern 18 is formed on the electrode material film 16a (FIG. 11C). The electrode material film 16a and the dielectric film 17 are etched by the dry etching and the like with using the resist pattern 18 as a mask. Thus, the upper electrode 16 and the dielectric film 17 corresponding to the upper electrode 16 are formed.

Next, after forming the upper electrode 16, the inter-layer dielectric film 15 is still further formed on the inter-layer dielectric film 15. Herein, the SiOF and the like-film, as the Low-k insulating film generally having lower dielectric constant than the SiO$_2$, is formed, as the inter-layer dielectric film 15, by the plasma CVD process. Then the last inter-layer dielectric film 15 is planarized by the CMP. After planarizing the inter-layer dielectric film 15, a silicon nitride 20a and the like serving as the etching stopper is thinly formed on the inter-layer dielectric film 15. Then the inter-layer dielectric film 15 is still further formed on the silicon nitride 20a (11D).

Then embedded-wirings are formed by the dual damascene process. Namely, through-holes 21 to be vias are firstly formed in the inter-layer dielectric film 15, silicon nitride 20a, and the inter-layer dielectric film 15 so as to reach the upper electrode 16 by the lithography process and the dry etching and the like (FIG. 12A).

Then the trench 22 and the trenches 23 are formed in the silicon nitride 20a and the inter-layer dielectric film 15 formed on the silicon nitride 20a (FIG. 12B). Herein, the trench 22 is connected to the through-holes 21. On the other hand, the trenches 23 reach the silicon nitride 20a. Then the Cu, a tantalum (Ta), tantalum nitride (TaN), and the like or layered film of these is provided on the interlayer dielectric film 15 after forming a barrier metal film (not shown). Thus, a metal film 24 is formed. Namely, the trench 22, the trenches 23, and the through-holes 21 are filled with the metal film 24 (FIG. 12C). The vias 14 electrically connect between the metal film 24 and the upper electrode 16. Then, an upper portion of the metal film 24 is removed by the CMP. Thus, the upper layer wirings 11 are formed (FIG. 10). Consequently, the embedded wiring structure is formed in the semiconductor device.

Thus, the upper electrode 16 is formed through the dielectric film 17 on the lower layer wiring 12 as the lower electrode. Consequently, the decoupling capacity is formed between the upper layer wiring 11 and the lower layer wiring 12.

Figure 13:
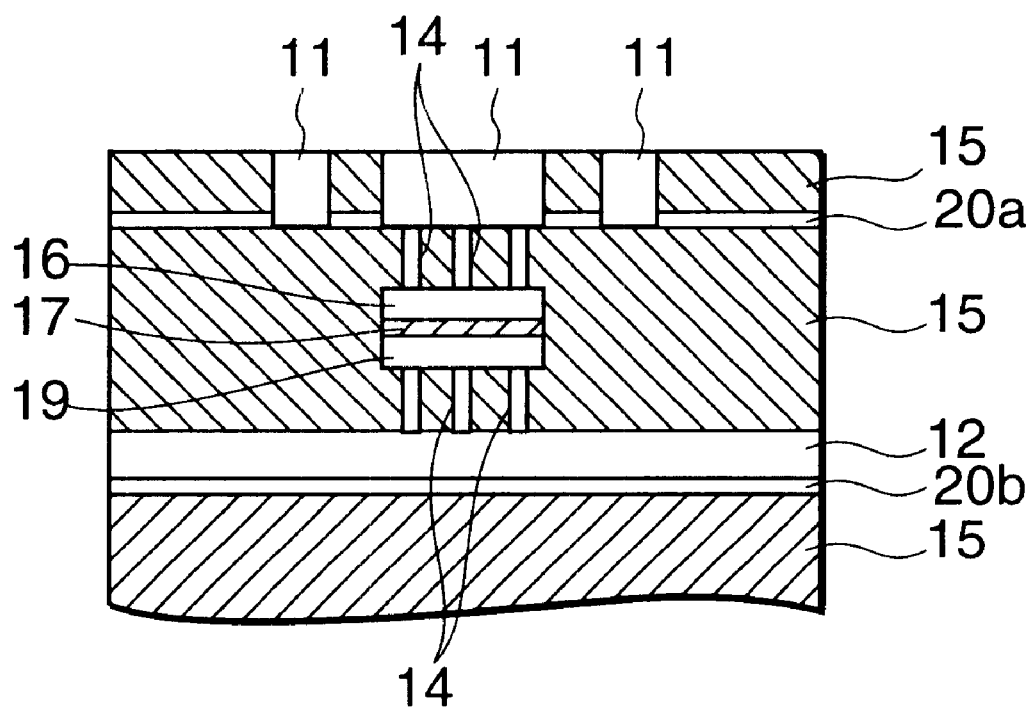
FIG. 13 is a cross sectional view, taken along the line B—B in FIG. 1, showing the semiconductor device which does not use a wiring as an electrode of a capacitor in the damascene process.
Figure 14A:
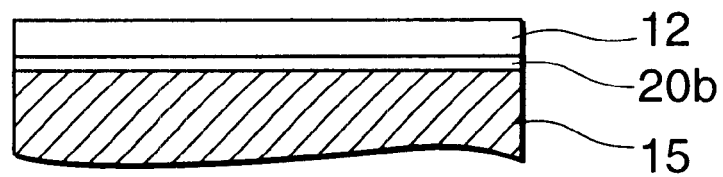
FIGS. 14A to 14C are cross sectional views illustrating (the first half of) a wiring process of the semiconductor device shown in FIG. 13.
Figure 14B:
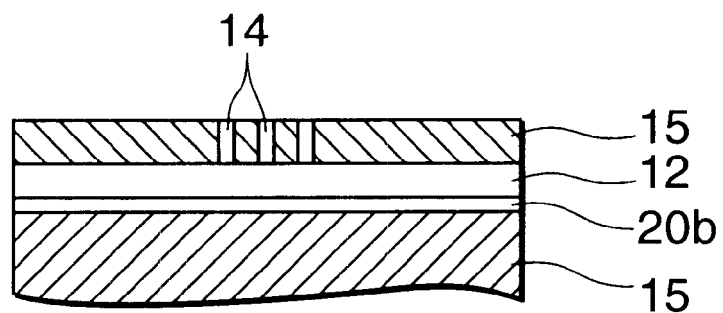
Figure 14C:
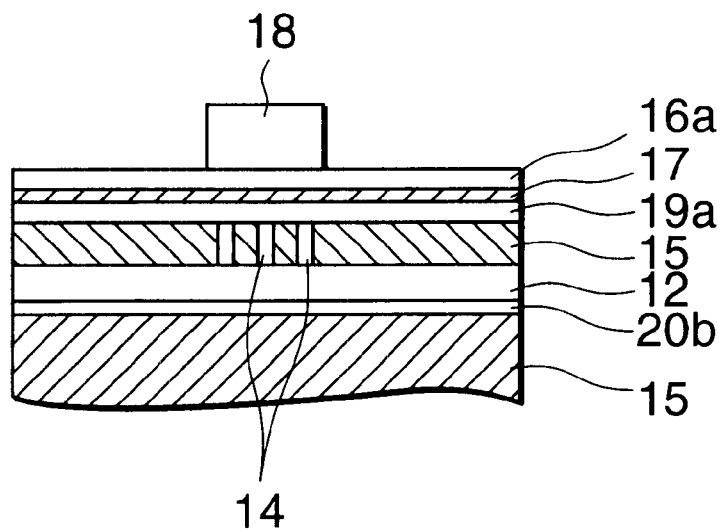

(2) Process B in which neither Lower nor Upper Layer Wirings is used as Electrodes of Capacitor FIG. 13 is a cross sectional view, along the line B—B in FIG. 1, showing the semiconductor device which uses neither lower nor upper layer wiring as an electrode of a capacitor in the damascene wiring process. FIGS. 14A to 14C are cross sectional views illustrating (the first half of) a wiring process of the semiconductor device shown in FIG. 13. FIGS. 15A to 15D are cross sectional views illustrating (the second half of) the wiring process of the semiconductor device shown in FIG. 13.

Referring to FIG. 13, the semiconductor device 10 (FIG. 1) uses neither the lower layer wiring 12 nor the upper layer wiring 11 as electrodes of a capacitor. A dielectric film 17 is formed in an inter-layer dielectric film 15 between the upper and the lower layer wirings 11 and 12. More concretely, the dielectric film 17 is formed between an upper electrode 16 electrically connected to the upper layer wiring 11 through the vias 14 and a lower electrode 19 electrically connected to the lower layer wiring 12 through the vias 14.

Referring to FIGS. 14A to 14C and 15D to 15G, the lower layer wiring 12 is formed on the silicon nitride 20B formed on the inter-layer dielectric film 15 (FIG. 14A) and the vias 14 are formed in the inter-layer dielectric film 15 formed on the lower layer wiring 12 (FIG. 14B), by the damascene process as like to the process B-1. The vias 14 reach and are electrically connected to the lower layer wiring 12.

Then the three-layers structure: the electrode material film 19a for forming the lower electrode 19, the dielectric film 17, and the electrode material film 16a for forming the upper electrode 16 are formed. The resist pattern 18 is formed on the electrode material film 16a after the lithography process (FIG. 14C). The inter-layer dielectric film 15 provided with the electrode material film 16a is etched by the dry etching and the like with using the resist pattern 18 as a mask. Thus, the upper electrode 16 and the dielectric film 17 corresponding to the upper electrode 16 are formed. Next, the inter-layer dielectric film 15 as the Low-k insulating film is still further formed on the inter-layer dielectric film 15 provided with the lower electrode 19, the dielectric film 17, and the upper electrode 16.

Figure 15A:
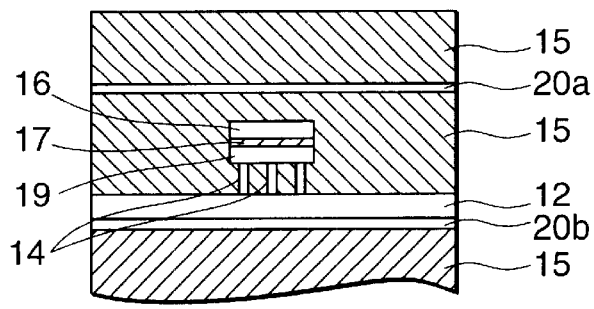
FIGS. 15A to 15D are cross sectional views illustrating (the second half of) the wiring process of the semiconductor device shown in FIG. 13.

Next, after planarizing the last inter-layer dielectric film 15, the silicon nitride (SiN) film 20B as the etching stopper is formed on the inter-layer dielectric film 15. Then the inter-layer dielectric film 15 is further formed on the SiN film 20B (FIG. 15A). These process-steps are like to the process B-1 shown in FIG. 11D.

Figure 15B:
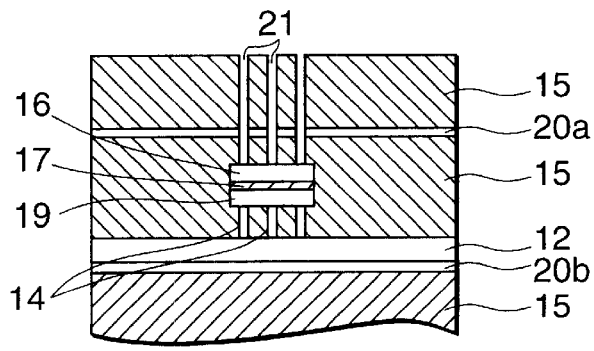

Then the embedded-wirings are formed by the dual damascene process. Namely, the through-holes 21 to be vias are firstly formed in the inter-layer dielectric film 15, silicon nitride 20a, and the inter-layer dielectric film 15 so as to reach the upper electrode 16 by the lithography process and the dry etching and the like (FIG. 15B).

Figure 15C:
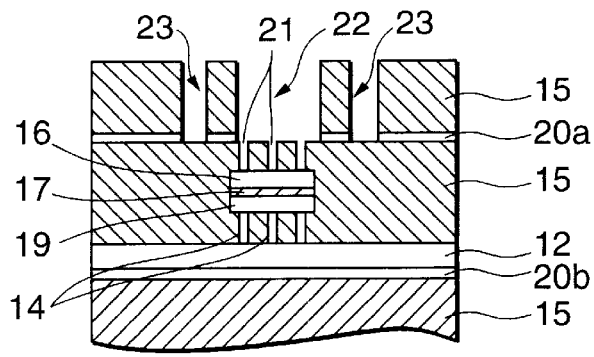
Figure 15D:
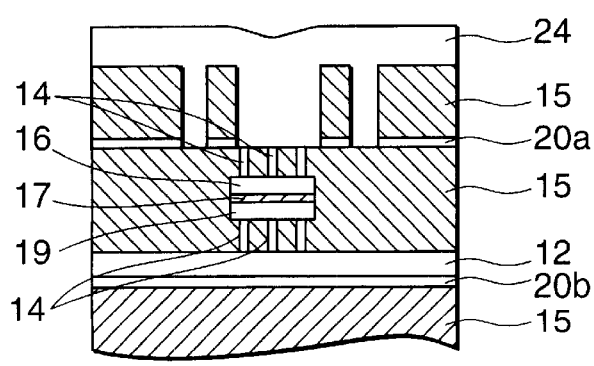

Then the trench 22 and the trenches 23 are formed in the silicon nitride 20a and the inter-layer dielectric film 15 formed on the silicon nitride 20a (FIG. 15C). Herein, the trench 22 is connected to the through-holes 21. On the other hand, the trenches 23 reach the inter-layer dielectric film 15. Then the Cu and the like or layered film of these is provided on the inter-layer dielectric film 15 after forming a barrier metal film (not shown). Thus, the metal film 24 is formed. Namely, the trench 22, the trenches 23, and the through-holes 21 are filled with the metal film 24 (FIG. 15D). The vias 14 electrically connect between the metal film 24 and the upper electrode 16. Then, an upper portion of the metal film 24 is removed by the CMP. Thus, the upper layer wirings 11 are completed (FIG. 13). Consequently, the embedded wiring structure is formed in the semiconductor device.

Thus, the upper electrode 16 is formed through the dielectric film 17 on the lower electrode 19. Consequently, the decoupling capacity is formed between the upper layer wiring 11 and the lower layer wiring 12. Namely, the capacitor is arranged between the upper layer wiring 11 and the lower layer wiring 12.

(3) Process B in which Upper Layer Wiring is used as Electrodes of Capacitor

Figure 16:
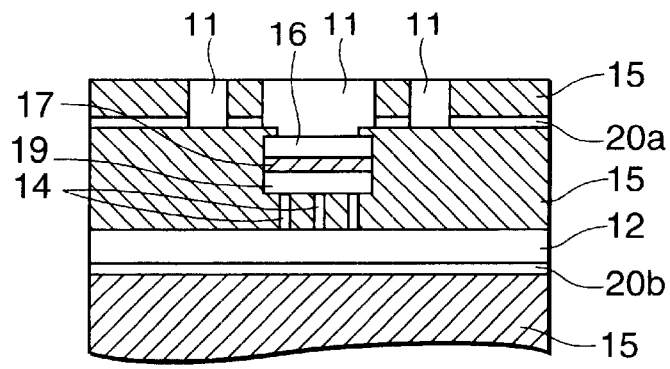
FIG. 16 is a cross sectional view, taken along the line B—B in FIG. 1, showing the semiconductor device which uses an upper layer wiring as an electrode of a capacitor in the damascene process.
Figure 17A:
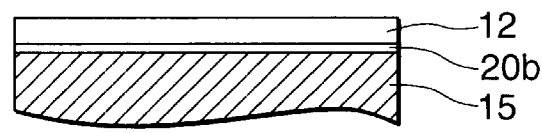
FIGS. 17A to 17C are cross sectional views illustrating (the first half of) a wiring process of the semiconductor device shown in FIG. 16.
Figure 17B:
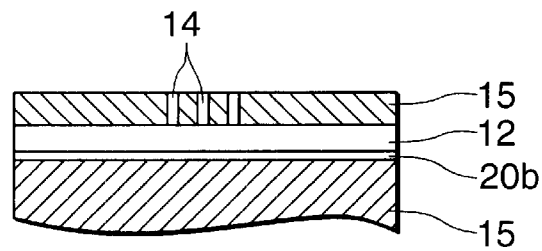
Figure 17C:
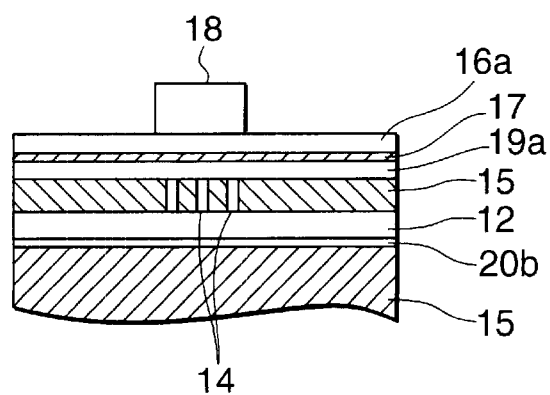

FIG. 16 is a cross sectional view, along the line B—B in FIG. 1, showing the semiconductor device which uses a lower layer wiring as an electrode of a capacitor in the damascene wiring process. FIGS. 17A to 17C are cross sectional views illustrating (the first half of) a wiring process of the semiconductor device shown in FIG. 16. FIGS. 18A to 18D are cross sectional views illustrating (the second half of) the wiring process of the semiconductor device shown in FIG. 16.

Referring to FIG. 16, the semiconductor device 10 (FIG. 1) uses the upper layer wiring 11 as an electrode of a capacitor. A dielectric film 17 is formed in an interlayer dielectric film 15 between the upper and the lower layer wirings 11 and 12. More concretely, the dielectric film 17 is formed between an upper electrode 16 and a lower electrode 19 electrically connected to the lower layer wiring 12 through the vias 14.

Referring to FIGS. 17A to 17C and 18D to 18G, the lower layer wiring 12 is formed on the silicon nitride 20B formed on the inter-layer dielectric film 15 (FIG. 17A) and the vias 14 are formed in the inter-layer dielectric film 15 formed on the lower layer wiring 12 (FIG. 17B), by the damascene process as like to the process B-1. The vias 14 reach and are electrically connected to the lower layer wiring 12.

Then the three-layers structure: the electrode material film 19a for forming the lower electrode 19, the dielectric film 17, and the electrode material film 16a for forming the upper electrode 16 are formed. The resist pattern 18 is formed on the electrode material film 16a after the lithography process (FIG. 17C). The inter-layer dielectric film 15 provided with the electrode material film 16a is etched by the dry etching and the like with using the resist pattern 18 as a mask. Thus, the upper electrode 16 and the dielectric film 17 corresponding to the upper electrode 16 are formed. Next, the inter-layer dielectric film 15 as the Low-k insulating film is still further formed on the inter-layer dielectric film 15 provided with the lower electrode 19, the dielectric film 17, and the upper electrode 16.

Figure 18A:
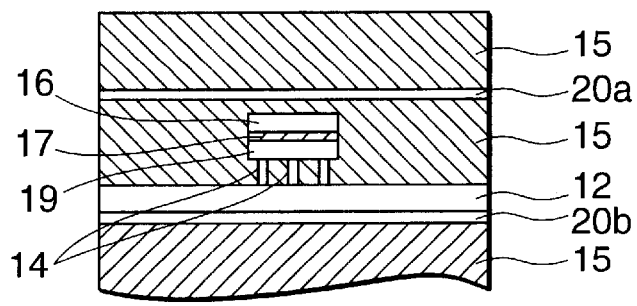
FIGS. 18A to 18D are cross sectional views illustrating (the second half of) the wiring process of the semiconductor device shown in FIG. 16.
Figure 18B:
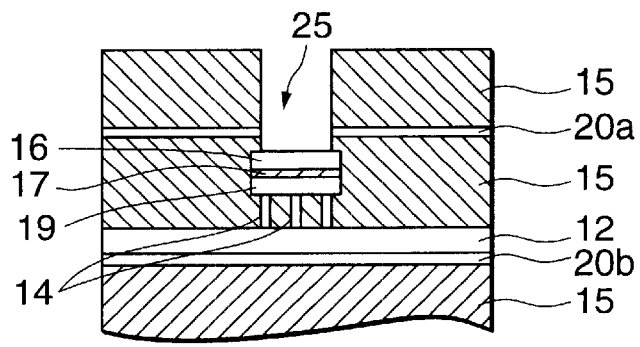
Figure 18C:
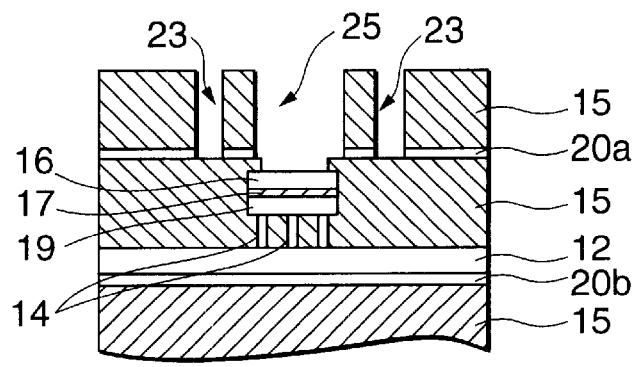

Next, after planarizing the last inter-layer dielectric film 15, the silicon nitride (SiN) film 20B as the etching stopper is formed on the inter-layer dielectric film 15. Then the inter-layer dielectric film 15 is further formed on the SiN film 20B (FIG. 18A). These process-steps are same as the process B-2 shown in FIG. 15A. Then the embedded-wirings are formed by the damascene process. Namely, a wiring-hole 25 to be vias are firstly formed in the inter-layer dielectric film 15, silicon nitride 20a, and the inter-layer dielectric film 15 so as to reach the upper electrode 16 and so that a major area of a top surface of the upper electrode 16 is upwardly exposed (that is so called as a head-digging) by the lithography process and the dry etching and the like (FIG. 18B). Then the trenches 23 are formed in the silicon nitride 20a and the inter-layer dielectric film 15 formed on the silicon nitride 20a (FIG. 18C). Herein, the trenches 23 reach the inter-layer dielectric film 15.

Although two process-steps are carried out in order to open the wiring-hole 25 and the trenches 23, it is sufficient only one process-step shown in FIG. 18B if the upper electrode 16 is exposed (the head-digging is carried out) when the inter-layer dielectric film 15 is treated by the CMP.

Figure 18D:
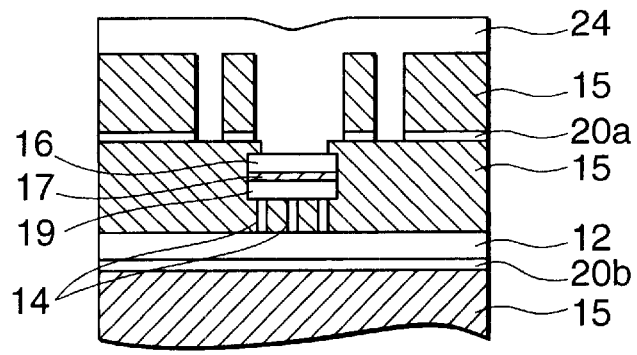

Then the Cu and the like as the metal film 24 is provided on the inter-layer dielectric film 15 is formed. The wiring hole 25 and the trenches 23 are filled with the metal film 24 (FIG. 18D). Next, an upper portion of the metal film 24 is removed by the CMP. Thus, the upper layer wirings 11 are formed (FIG. 16).

Thus, the upper electrode 16 is formed through the dielectric film 17 on the lower electrode 19 electrically connected to the lower layer wiring 12 through the vias 14. Consequently, the decoupling capacity is formed between the upper layer wiring 11 and the lower layer wiring 12.

In the embodiments mentioned above, as each material of the dielectric film 17, the upper and the lower electrodes 16 and 19 (the upper and the lower layer wirings 11 and 12), the following materials can be used according to each thin film forming process.

As the materials of the dielectric film 17, high dielectric material such as $Si_3N_4$, $SiO_2$ (in the CVD process such as the plasma CVD), $Ta_2O5$ (in a P (Physical) VD process and the CVD process), BST (in the CVD and the PVD processes), and PZT (in the PVD process, a sol gel process, and the CVD process) can be used. The dielectric film 17 can be single- or multi-layer.

As the materials of the lower electrodes 16 and 19, conductive oxidation material such as W (in the PVD and the CVD processes), Al alloy (in the PVD process), Cu (in the PVD process), TiN, Ta, TaN, Ti, WN (in the PVD and the CVD processes), and $RuO_2$ (in the PVD and the CVD processes). The lower electrodes 16 and 19 can be single- or multilayer.

As mentioned above, the semiconductor device according to this invention has the capacitor which is formed between the power supply and the GND wirings in which the upper and/or the lower layer wiring is used as at least one part of the electrode of the capacitor. Consequently, the semiconductor device performs sufficient and high capacitance with the no use of large area for forming the internal bypass capacitor only. Furthermore, the semiconductor device can restrain an IR drop of a power supply line and stabilize potential. The electrode is electrically connected to the wiring faced thereto through the insulating film.

Because the capacitor is formed where the power supply wiring and the GND wiring of the upper and the lower layer intersect to each other, a large number of capacitors can be formed at optional locations. Furthermore, because a plurality of capacitors connected in parallel to one another is formed per the power supply wiring or the GND wiring, the semiconductor device can performs sufficient and high capacitance.

Namely, the semiconductor device according to this invention has the capacitor which is formed in a vacant space between the power supply and the GND wirings. Thus, the semiconductor device never wastes a space therein and can be therefore reduced in size. Furthermore, it is sufficient for the method of producing the semiconductor device of the least number of the mask. Consequently, the semiconductor device is reduced in cost.

While this invention has thus far been described in conjunction with the embodiments thereof, it will readily be possible for those skilled in the art to put this invention into practice in various other manners. For example, although the aluminum or the copper is used as the material of the wiring when the semiconductor device is a silicon device, when the material is not so limited to when the semiconductor device is not the silicon device.

In addition, as the inter-layer dielectric film of the semiconductor device produce by the damascene process, the low dielectric (Low-k) insulating film is preferred.

What is claimed is:

1. A semiconductor device comprising first and second layer wirings formed with a space left therebetween and a capacitor formed in said space and electrically connected to said first and said second layer wirings, said space being filled with an inter-layer dielectric film;

wherein said capacitor comprises a via electrically connected to one of said first and said second layer wirings, and electrode made of a conductive material and electrically connected to said one of said first and said second layer wirings through said via, and a dielectric film formed between said electrode and the other of said first and said second layer wirings, said electrode being distinct from said first and said second layer wirings;

said dielectric film being distinct said inter-layer dielectric film.

2. A semiconductor device as claimed in claim 1, wherein said one of said first and said second layer wirings is an upper layer wiring;

the other of said first and said second layer wirings being a lower layer wiring.

3. A semiconductor device as claimed in claim 2, wherein said electrode is electrically connected to said upper layer wiring through said via;

said capacitor further comprising an additional via electrically connected to said lower layer wiring and an additional electrode electrically connected to said lower layer wiring through said additional via;

said additional electrode being distinct from said first and said second layer wirings;

said dielectric film being formed between said electrode and said additional electrode.

4. A semiconductor device as claimed in claim 1, wherein said via is constructed by a plurality of via-pieces;

said via-pieces being formed by driving in tacks.

5. A semiconductor device as claimed in claim 2, wherein said one of said first and said second layer wirings is a power supply wiring;

the other of said first and said second layer wirings being a grounding wiring;

said capacitor being formed where said power supply and said grounding wirings intersect to each other, respectively.

6. A semiconductor device as claimed in claim 2, wherein said one and the other layer wirings are constructed by a plurality of pairs of a power supply wiring and a grounding wiring alternatively arranged on each other along said one and the other layer wirings, respectively;

said capacitor being formed where said power supply and said grounding wirings intersect to each other, respectively;

the capacitors being electrically connected in parallel to one another.

7. A semiconductor device as claimed in claim 1, wherein said dielectric film is made by at least one high dielectric film selected from the group consisting of an oxide film, a nitride film, a tantalum oxide film, and a barium strontium titanate (BST) film.

* * * * *